(12) United States Patent
Antonesei

(10) Patent No.: US 8,907,655 B2
(45) Date of Patent: Dec. 9, 2014

(54) SYSTEM AND METHOD FOR DETECTING A FUNDAMENTAL FREQUENCY OF AN ELECTRIC POWER SYSTEM

(75) Inventor: Gabriel Antonesei, Woburn, MA (US)

(73) Assignee: Analog Devices, Inc., Norwood, MA (US)

( * ) Notice: Subject to any disclaimer, the term of this patent is extended or adjusted under 35 U.S.C. 154(b) by 579 days.

(21) Appl. No.: 13/097,796

(22) Filed: Apr. 29, 2011

(65) Prior Publication Data

US 2012/0274311 A1  Nov. 1, 2012

(51) Int. Cl.
*G01R 23/00* (2006.01)
*G01R 25/00* (2006.01)
*G01R 23/12* (2006.01)
*G01R 23/02* (2006.01)
*G01R 23/14* (2006.01)

(52) U.S. Cl.
CPC ............... *G01R 23/12* (2013.01); *G01R 23/02* (2013.01); *G01R 23/14* (2013.01)
USPC .................................... 324/76.52; 324/76.79

(58) Field of Classification Search
CPC ......... G01R 23/12; G01R 23/02; G01R 23/00
USPC ........................................... 324/76.52, 76.79
See application file for complete search history.

(56) References Cited

U.S. PATENT DOCUMENTS

| 3,984,771 | A | 10/1976 | Nossen et al. |
| 4,224,671 | A | 9/1980 | Sugiyama et al. |
| 4,878,185 | A | 10/1989 | Brand et al. |
| 5,321,350 | A | 6/1994 | Haas |
| 5,381,085 | A | 1/1995 | Fischer |
| 5,483,153 | A | 1/1996 | Leeb et al. |
| 5,572,167 | A * | 11/1996 | Alder et al. ................... 331/2 |
| 5,587,917 | A | 12/1996 | Elms |
| 6,016,080 | A | 1/2000 | Zuta et al. |
| 6,078,870 | A | 6/2000 | Windsheimer |
| 6,397,157 | B1 | 5/2002 | Hogle et al. |
| 7,756,487 | B2 | 7/2010 | Lerner et al. |
| 8,010,304 | B2 | 8/2011 | Lu et al. |
| 8,508,303 | B2 * | 8/2013 | Maeda ...................... 331/1 A |
| 2004/0022338 | A1 | 2/2004 | Altmann et al. |
| 2005/0096879 | A1 | 5/2005 | Waite et al. |

(Continued)

FOREIGN PATENT DOCUMENTS

WO  02/91578 A2  11/2002

OTHER PUBLICATIONS

Best, Roland E. "Phase-Locked Loops: Design, Simulation, and Applications." Sixth Edition. New York: The McGraw-Hill Companies, Inc., 2007, pp. 13-37.

(Continued)

*Primary Examiner* — Amy He
(74) *Attorney, Agent, or Firm* — Kenyon & Kenyon, LLP

(57) ABSTRACT

A system and method to detect the fundamental frequency of an electric input signal using a feedback control loop including a phase error detector, a loop controller, and a digitally controlled oscillator. The frequency detector may detect the fundamental frequency of an electric input signal and produce an output signal representing the fundamental frequency of the electric input signal. The frequency detector may further include a filter that may be coupled to the frequency detector output signal in order to remove spurious tones or noise from the output signal.

9 Claims, 6 Drawing Sheets

(56) References Cited

U.S. PATENT DOCUMENTS

| | | | |
|---|---|---|---|
| 2005/0159929 A1 | 7/2005 | Overby et al. |
| 2009/0088113 A1 | 4/2009 | Marsili et al. |
| 2009/0307293 A1 | 12/2009 | Wu et al. |
| 2010/0088049 A1 | 4/2010 | Lu et al. |
| 2010/0213925 A1 | 8/2010 | Teodorescu et al. |

OTHER PUBLICATIONS

International Search Report and Written Opinion dated Aug. 17, 2012 in PCT/US2012/035256, filed Apr. 26, 2012.

Cirrus Logic, "CS5463: Single Phase, Bi-directional Power/Energy IC," Datasheet DS678F2, Apr. 2008.

Maxim Integrated Products, "MAXQ3183: Low-Power, Multifunction, Polyphase AFE with Harmonics and Tamper Detect," Datasheet 19-4955, Dec. 2009.

Moreira et al., "Virtual Instrumentation Applied to the Implementation of IEEE STD 1459-2000 Power Definitions", Proceedings of the 36th IEEE Power Electronics Specialists Conference (PESC '05), Jun. 2005, pp. 1712-1718.

Cataliotti, et al., "A Time-Domain Strategy for the Measurement of IEEE Standard 1459-2000 Power Quantities in Nonsinusoidal Three-Phase and Single-Phase Systems", IEEE Transactions on Power Delivery, vol. 23, No. 4, Oct. 2008, pp. 2113-2123.

Tahri et al., "Design of a Simple Measuring Technique of the Instantaneous Power in Three Phase System", Journal of Electrical Engineering, vol. 56, No. 7-8, 2005, pp. 221-224.

Matsui et al., "A Simple Harmonic Meter Using Phase Locked Loop", Proceedings of the 24th Annual Conference of the IEEE Industrial Electronics Society (IECON '98), Sep. 1998, pp. 1550-1553.

International Preliminary Report on Patentability issued Apr. 5, 2011, for International application No. PCT/US2009/059352, 8 pages.

International Search Report and Written Opinion dated Aug. 3, 2012 in PCT/US2012/035261, filed Apr. 26, 2012.

\* cited by examiner

300

400

600

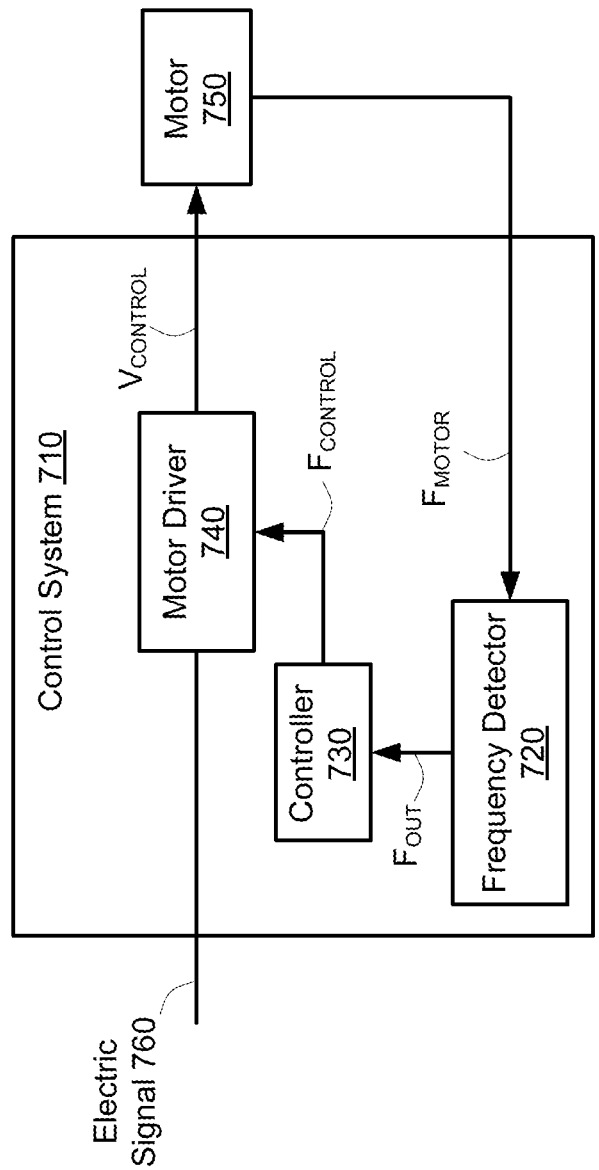

SYSTEM AND METHOD FOR DETECTING A FUNDAMENTAL FREQUENCY OF AN ELECTRIC POWER SYSTEM

RELATED APPLICATION

This application relates to co-pending application "APPARATUS AND METHOD FOR REAL TIME HARMONIC SPECTRAL ANALYZER," U.S. patent application Ser. No. 13/098,305, also filed on Apr. 29, 2011.

BACKGROUND

Frequency detectors are devices that determine frequency and phase information for signals. Frequency detectors are used in communication and power systems as well as consumer electronic devices to aid in synchronizing multiple signals at varying frequencies to a known frequency. A first electrical system may be embodied, for example, as a power grid transmitting electricity with a frequency that may drift over time. A second electrical system may be embodied as a generator for injecting electricity into the power grid. In order to be injected efficiently, however, the frequency of the generated power must be phase aligned with the grid power. Thus, a frequency detector may be used within the generator to detect the shifting power grid frequency and synchronize its generated electricity to the grid frequency for injection.

Zero-crossing detection methods have been used to determine signal frequencies. Zero-crossing detectors may be implemented in either hardware or software systems. A sinusoidal signal may be quantitatively measured using an X-Y plane. The X-axis may represent time and the Y-axis may represent signal amplitude. The signal amplitude may oscillate between a positive peak and a negative peak about the median "zero-level" amplitude for the signal. The zero-level amplitude may be equivalent to system ground. A zero-crossing detector may calculate the rate at which a sinusoidal signal may oscillate about a Y-axis zero-level amplitude over an X-axis time period to determine the signal frequency. For each time the signal crosses the zero-level amplitude, the zero-crossing detector may increment a counter. For example, a sinusoidal signal that crosses the zero-level amplitude Y-axis 120 times in one second may be detected as having a 60 Hz frequency—two crossings may represent a complete signal cycle.

A zero-crossing detector may be implemented by sampling an unknown signal to count each zero-level amplitude crossing of the signal. A limitation of zero-crossing detectors is that they must operate at a high sampling rate in order to count each zero-level signal crossing. This is necessary because zero-crossing detectors compare individual amplitude sample values to an anticipated zero-level amplitude value to determine if the zero-level has been crossed. If the input signal is sampled too slowly, the zero-crossing detector may "miss" the zero-level sample value and thus incorrectly estimate the input signal frequency. The sampling rate must operate several orders of magnitude faster than the signal frequency being detected. A high sampling rate translates to a high operating power for zero-crossing detection methods. Another limitation of zero-crossing detectors is that they count all zero-level amplitudes. If a sinusoidal signal is particularly noisy (e.g., it has a lot of spurious artifacts that distort the sinusoid), a zero-crossing detector is unable to differentiate spurious zero-levels from actual signal zero-levels. Thus, zero-crossing detectors often require input signals to be pre-conditioned to remove such noise. This signal pre-conditioning requires the implementation of additional devices which consume silicon area to remove the signal noise prior to the zero-crossing detection.

Accordingly, there is a need in the art for a frequency detector that conserves power and minimizes silicon area.

BRIEF DESCRIPTION OF THE DRAWINGS

FIG. 7 is a block diagram of an exemplary system suitable for use with frequency detectors of the foregoing embodiments.

DETAILED DESCRIPTION

Embodiments of the present invention provide techniques to perform frequency detection with reduced silicon area and power consumption. According to such embodiments, a frequency detector may be implemented as a feedback control loop including a phase error detector, a loop controller, and a digitally controlled oscillator. The frequency detector may detect the fundamental frequency of an input signal and produce an output signal representing the fundamental frequency of the input signal. The frequency detector may further include a filter that may be coupled to the frequency detector output signal in order to remove spurious tones or noise from the output signal. The silicon area and power consumption necessary to implement a frequency detector as a feedback control loop and filter may be less than the area and power consumption required to implement a zero-crossing detector.

Figure 1:
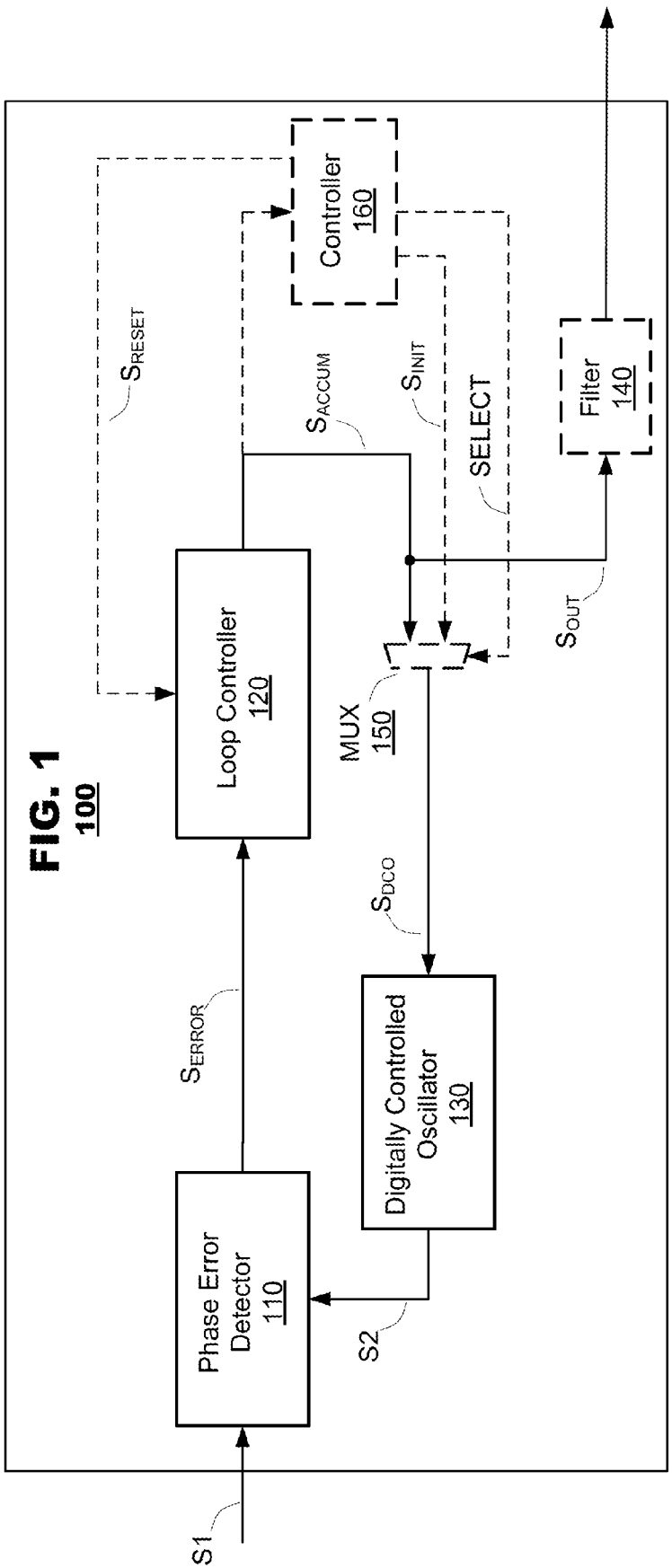
FIG. 1 illustrates a block diagram of a frequency detector according to an embodiment of the present invention.

As illustrated in FIG. 1, an embodiment of a frequency detector 100 may include a phase error detector 110, a loop controller 120, and a digitally controlled oscillator (DCO) 130. The phase error detector 110 may generate an output signal $S_{ERROR}$ representing a phase comparison between an externally-supplied input signal S1 and a locally generated reference signal S2. The phase difference between the two signals may be represented as a signed real number. The loop controller 120 may accumulate a running average of phase error decisions from the phase error detector 110 and generate an output control signal $S_{ACCUM}$ therefrom. The DCO 130 may generate a reference signal S2 from the $S_{ACCUM}$ value generated by the loop controller 120. During operation, the frequency detector 100 may drive the S2 signal in a manner that minimizes the phase errors with the input signal. The reference signal S2 frequency may lock onto the input signal S1 frequency. When it does, the loop controller output control signal $S_{ACCUM}$ may represent the fundamental frequency of the input signal S1. The loop controller output control signal $S_{ACCUM}$ may further be the output of the frequency detector 100 indicated as the output signal $S_{OUT}$ representing a signal having a frequency that is locked to the fundamental frequency of the input signal S1.

In an embodiment a filter 140 may be implemented to filter the output signal $S_{OUT}$. The filter 140 may be configured based on the expected frequency drift of the input signal S1 to filter undesired noise or side-tones from the output signal $S_{OUT}$. In a power system application, for example, the frequency of electricity within the power system may drift slowly over long periods of time (e.g., several hours). In such applications, the filter 140 may be configured to filter frequency changes in the output signal $S_{OUT}$ that may occur quickly over short periods of time (e.g., less than one second).

The frequency detector 100 may find use in applications where the input signal S1 may have an unknown time-varying fundamental frequency. For example, the input signal S1 may be an electric signal having an expected fundamental frequency of 60 Hz. However, its actual fundamental frequency may drift away from 60 Hz over time, for example, drifting to 55 Hz. Determining the fundamental frequency of the input electric signal S1 may be performed to support signal processing calculations with the signal. For example, determining the fundamental frequency of an electric input signal S1 may allow for efficient algorithms to measure the energy present on the signal. In another example, determining the fundamental frequency of an electric input signal S1 may allow for efficient injection of electricity into a power system.

In an embodiment, the frequency detector 100 also may include a multiplexer (MUX) 150 and a controller 160. The controller 160 may generate an initialization signal $S_{INIT}$ that approximates the expected frequency of the input signals S1. The MUX 150 may have inputs for the loop controller output control signal $S_{ACCUM}$ and initialization signal $S_{INIT}$ and may output one of these signals to the DCO 130 via the DCO control signal $S_{DCO}$. Selection may be controlled by the controller 160 via the SELECT control signal. The controller may further reset the loop controller 120 running average to zero upon initialization or reset via the reset signal $S_{RESET}$.

In an embodiment, the frequency detector 100 may function in two states, an initialization state and an active state. Throughout both states, the frequency detector 100 may operate in a feedback control loop to converge on the fundamental frequency of the input signal S1. Stated another way, the goal of the frequency detector 100 is to minimize the phase error between the input signal S1 and the reference signal S2. To minimize the phase error between the two signals, the frequency detector 100 may self-adjust the frequency of the reference signal S2 by varying the DCO input control signal $S_{DCO}$. For example, a positive value input control signal $S_{DCO}$ may cause the DCO 130 to speed up the frequency of the reference signal S2. Conversely, a negative input control signal $S_{DCO}$ may cause the DCO 130 to slow down the frequency of the reference signal S2. The range of frequencies that the DCO 130 may generate and the corresponding range of input control signals $S_{DCO}$ may be system-configurable parameters. As the frequency detector converges and the phase error between the two signals is minimized, the output signal $S_{OUT}$ may represent the fundamental frequency of the input signal S1.

In order to efficiently converge on the unknown fundamental frequency of the input signal S1, the frequency detector 100 may be initialized to produce a reference signal S2 that is near an expected fundamental frequency of the input signal S1. For example, although a fundamental frequency of an input signal S1 may be at 55 Hz, an initialization signal $S_{INIT}$ may be input to the system at 60 Hz. Such an initialization signal $S_{INIT}$ may allow the frequency detector 100 to efficiently converge on the unknown fundamental frequency of the input signal S1 within a short period of time. The frequency detector 100 tolerance for an acceptable initialization signal $S_{INIT}$ may be a system-configurable feature and relate to the expected fundamental frequency of the input signal S1 and an acceptable convergence time for the frequency detector 100.

The initialization and active states may be distinguished by which signal, $S_{ACCUM}$ or $S_{INIT}$, may set the DCO control signal $S_{DCO}$ values. For the initialization state, $S_{INIT}$ may set the DCO control signal $S_{DCO}$ values. During the active state, the loop controller output control signal $S_{ACCUM}$ may set the DCO control signal $S_{DCO}$ values. Thus, various embodiments may be envisioned for determining which signal ($S_{ACCUM}$ or $S_{INIT}$) drives the DCO frequency.

In an embodiment, the controller 160 may activate the MUX 150 to select either the $S_{INIT}$ or the $S_{ACCUM}$ signal to set the DCO control signal $S_{DCO}$ values. At initialization, the controller 160 may reset the loop controller 120 running average to zero via the reset signal $S_{RESET}$. This may clear any residual values that may have been stored in the loop controller 120 from prior frequency detections and may cause the loop controller output control signal $S_{ACCUM}$ to equal zero.

Further, the controller 160 may activate the MUX 150 to select the initialization signal $S_{INIT}$ to set the DCO control signal $S_{DCO}$ values. The DCO 130, in turn, may seed the frequency detector 100 with a reference signal S2 near the expected fundamental frequency of the input signal S1. Next, the phase error detector 110 may compare the phase alignment between the input signal S1 and the reference signal S2 and generate an output error signal $S_{ERROR}$ based on this comparison. The phase error comparison may indicate if the reference signal S2 phase is leading or lagging the input signal S1 phase by calculating the difference between the phase of the signal. For example, the phase error detector may receive an input signal S1 with a 55 Hz frequency and a reference signal S2 with a 60 Hz frequency. In this case, the reference signal S2 frequency may be leading the input signal S1 frequency by 5 Hz (i.e., 60 Hz−55 Hz=5 Hz). The phase error detector 110 output error signal $S_{ERROR}$, therefore, might represent a positive phase error value and indicate that the frequency of the reference signal S2 should be slowed down accordingly.

After the frequency detector 100 is initialized, the loop controller 120 may begin to build a running average of successive phase error signals $S_{ERROR}$. In various embodiments, the controller 160 may activate the MUX 150 to select the loop controller output control signal $S_{ACCUM}$ to set the DCO control signal $S_{DCO}$ values after either a predetermined time period or a check for non-zero values of the loop controller output control signal $S_{ACCUM}$. In an embodiment, a switch may be implemented and controlled by the controller 160 to select an appropriate signal to set the DCO control signal $S_{DCO}$ values. In another embodiment, a mixer may be implemented to set the DCO control signal $S_{DCO}$ values and the controller 160 may enable and disable the $S_{INIT}$ and $S_{ACCUM}$ values to the mixer based on the appropriate state. In selecting the loop controller output control signal $S_{ACCUM}$ to set the DCO control signal $S_{DCO}$ values, the frequency detector 100 may transition into the active state. Similar to the initialization state, the frequency detector 100 may operate in the active state to minimize the phase error between the input signal S1 and the reference signal S2. As the frequency detector 100 converges on the fundamental frequency of the input signal S1, the output signal $S_{OUT}$ may represent the fundamental frequency of the input signal S1.

In another embodiment, the controller 160 may further compare the frequency of the frequency detector output signal $S_{OUT}$ with the expected frequency of the input signal S1. If the frequency of $S_{OUT}$ diverges significantly from the expected frequency of the input signal S1, the controller 160 may reinitialize the frequency detector 100. The controller 160 may reset the loop controller 120 running average back to zero via the reset signal $S_{RESET}$ and activate the MUX 150 to select the initialization signal $S_{INIT}$ to set the DCO control signal $S_{DCO}$ values. Thus, the DCO 130 may re-seed the frequency detector 100 with a reference signal S2 near the expected frequency of the input signal S1 and the frequency detector 100 convergence process may restart. The limits that the two signals may diverge may be a system-configurable feature.

Because the frequency detector 100 operates to converge on the fundamental frequency of the input signal S1 rather than count each zero-level crossing of the input signal, a system implementing a frequency detector 100 need only sample the input signal S1 at a rate sufficient to provide an accurate representation of the input signal S1. In comparison, a zero-crossing detector must sample the input signal S1 at a rate much faster than the input signal frequency in order to detect each and every instance that the input signal S1 amplitude equals the zero-level amplitude. Thus, a frequency detector 100 operating at a much slower sampling rate than a zero-crossing detector may draw less power than a similarly situated zero-crossing detector.

Furthermore, a frequency detector 100 may be minimally affected by noise or spurious artifacts present on an input signal S1. As noted, the frequency detector loop controller 120 may operate to accumulate a running average of the phase error between the input signal S1 and the reference signal S2. Therefore, even if a single sample of the input signal contains an instantaneous spur, the effect of that single sample on the accumulated average of phase error signals may be minimal. Any noise present on an input signal S1 may merely result in a longer convergence time for the frequency detector 100, but the frequency detector should still converge on the fundamental frequency of the input signal S1. Thus, the frequency detector 100 may not require any pre-filtering or signal conditioning for the input signal S1 and may therefore be implemented within a reduced silicon area compared to a similarly situated zero-crossing detector.

Figure 2:
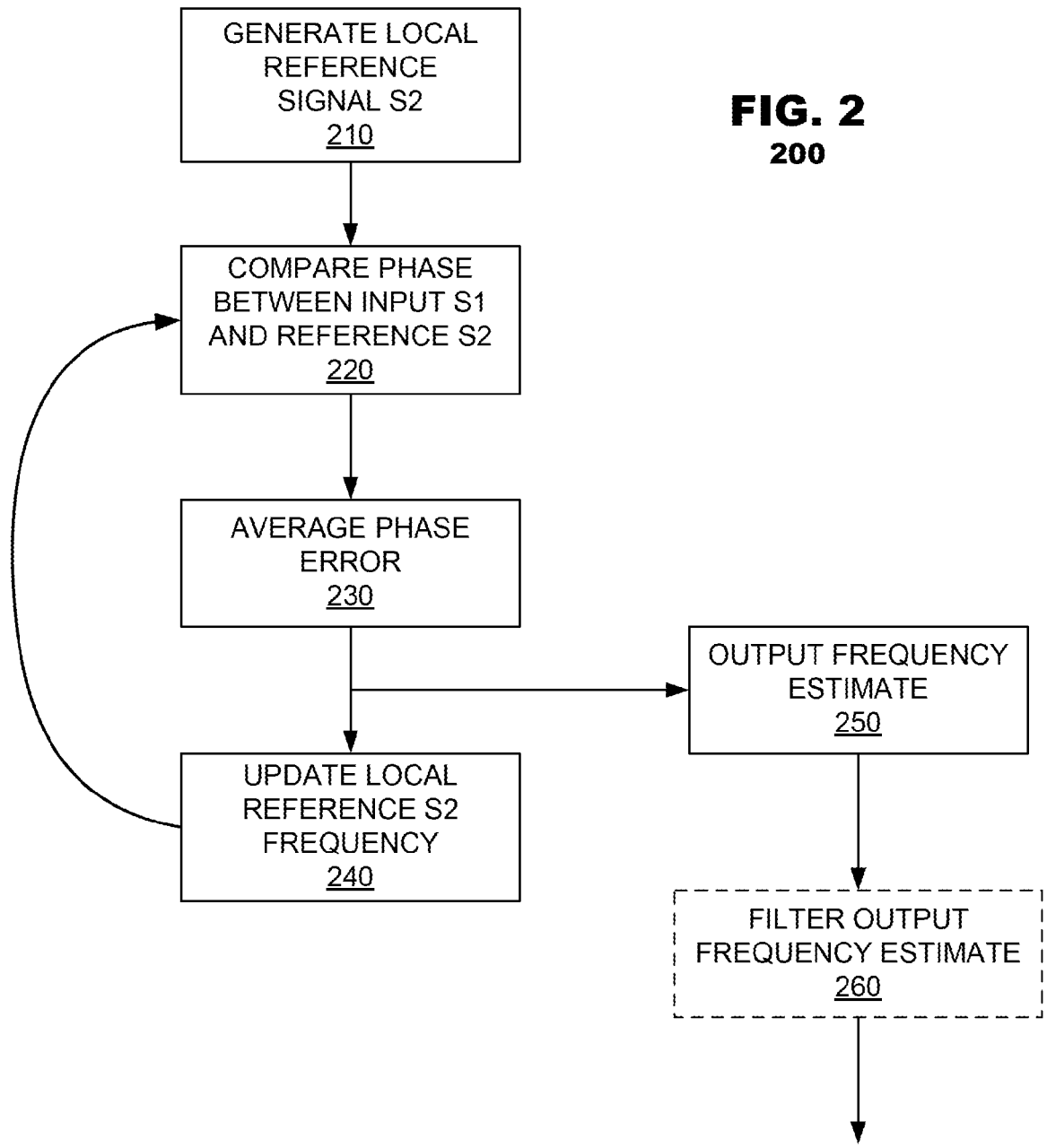
FIG. 2 illustrates a method for detecting the fundamental frequency of an input signal having an unknown fundamental frequency according to an embodiment of the present invention.

FIG. 2 illustrates a method 200 according to an embodiment of the present invention for detecting the fundamental frequency of an input signal S1 having an unknown fundamental frequency. As illustrated in block 210, the frequency detector operation 200 may include generating a local reference signal S2 with a frequency equal to the expected frequency of the input signal S1. The local reference signal may be generated by a DCO. The phase between the local reference signal S2 and the input signal S1 may be compared to determine the phase error between the two signals (block 220). The resultant phase error may then be averaged to produce a frequency estimate of the fundamental frequency of the input signal S1 (block 230). The frequency estimate may be used update the frequency of the local reference signal S2 generated by the DCO (block 240). Through successive loops, the updated local reference signal S2 may be compared to the input signal S1 to produce successive phase error comparisons between the two signals (return to block 220).

As frequency detector operation 200 continues in this looping manner, the estimate may converge on the fundamental frequency of the input signal S1. The frequency estimate may be output for further processing (block 250). In an embodiment, the output frequency estimate may be filtered to remove spurious tones or noise (block 260).

Figure 3:
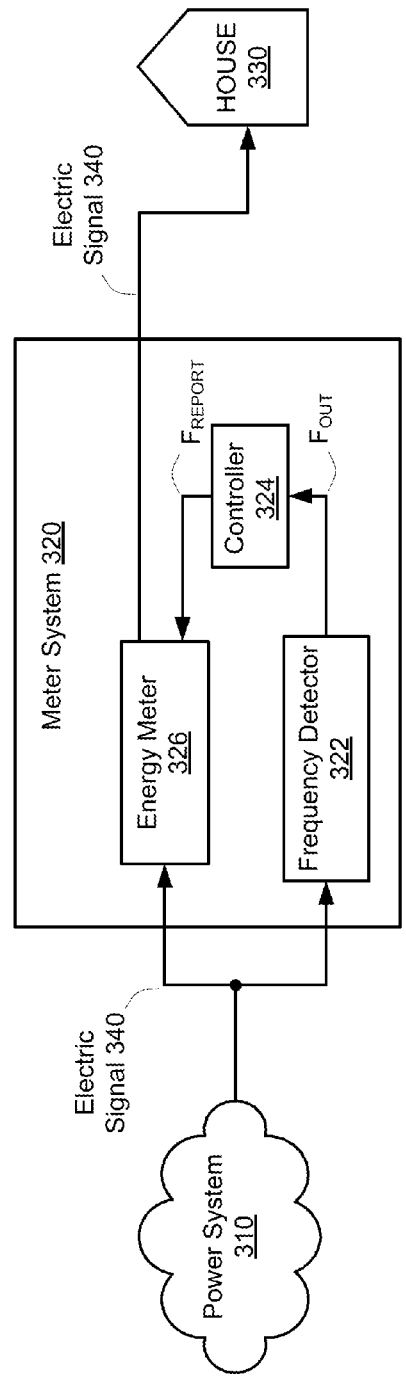
FIGS. 3-4 are block diagrams of exemplary systems suitable for use with frequency detectors of the foregoing embodiments.

As illustrated in FIG. 3, a frequency detector may find use in an energy measurement system 300 where detecting the fundamental frequency of electricity may provide a basis for determining the power consumption of a load (illustrated here as a house 340) coupled to an electrical power system. In such applications, determining the fundamental frequency of the power delivered to the load as opposed to just the expected fundamental frequency of the power of may provide for more efficient algorithms that determine power usage by the load.

In an energy measurement system 300, an electric signal 340 from a power system 310 may flow through a meter system 320 to a house 330. An embodiment of a meter system 320 may include a frequency detector 322, a controller 324, and an energy meter 326. The electric signal 340 may be coupled to both the frequency detector 322 and the energy meter 326. The frequency detector 322 may detect the fundamental frequency of the input electric signal and may output a signal $F_{OUT}$ with a frequency locked to the fundamental frequency. The controller 324 may receive the frequency detector output signal $F_{OUT}$ and may generate an output signal $F_{REPORT}$ representing a report of the fundamental frequency and harmonic frequency characteristics. The energy meter 326 may further receive the controller output and use the report to calculate the power usage of the house 330 as the electric signal 340 flows through the energy meter to the house 330.

Figure 4:
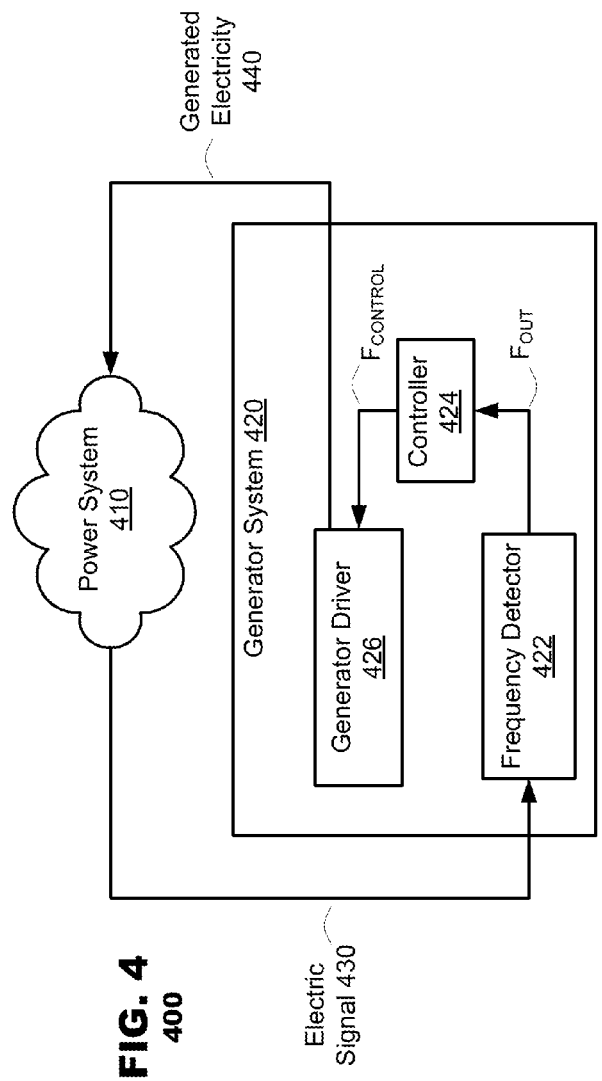

As illustrated in FIG. 4, a frequency detector may also find use in a power generation system 400 where the frequency of electricity injected to a power system must be phase aligned to electricity flowing through the system. Using a frequency detector, a power generator may produce electricity at a frequency that tracks the fundamental frequency of electricity flowing in a power system thus providing for efficient injection of the generated electricity into the power system.

In a power generation system 400, an electric signal 430 from a power system 410 may flow into a generator system 420. An embodiment of a generator system 420 may include a frequency detector 422, a controller 424 and a generator driver 426. The input electric signal 430 flowing into the generator system 420 may be coupled to the frequency detector 422. The frequency detector 422 may detect the fundamental frequency of the input electric signal and may output a signal $F_{OUT}$ with a frequency locked to the fundamental frequency. The controller 424 may receive the frequency detector output signal $F_{OUT}$ and generate an output control signal $F_{CONTROL}$ that may tune the generator driver 440 to inject generated electricity 440 back into the power system 41 at the fundamental frequency (and phase) of the electricity present in the power system 410. In various embodiments, the generator driver 440 may be a hydrocarbon, a photovoltaic, a hydroelectric, or a wind power generator. Even as the fundamental frequency of the electricity in the power system 410 may drift over time, the frequency detector 422 may keep the frequency of the generated electricity 460 locked to the drifting fundamental frequency of electricity in the power system 410.

Figure 5:
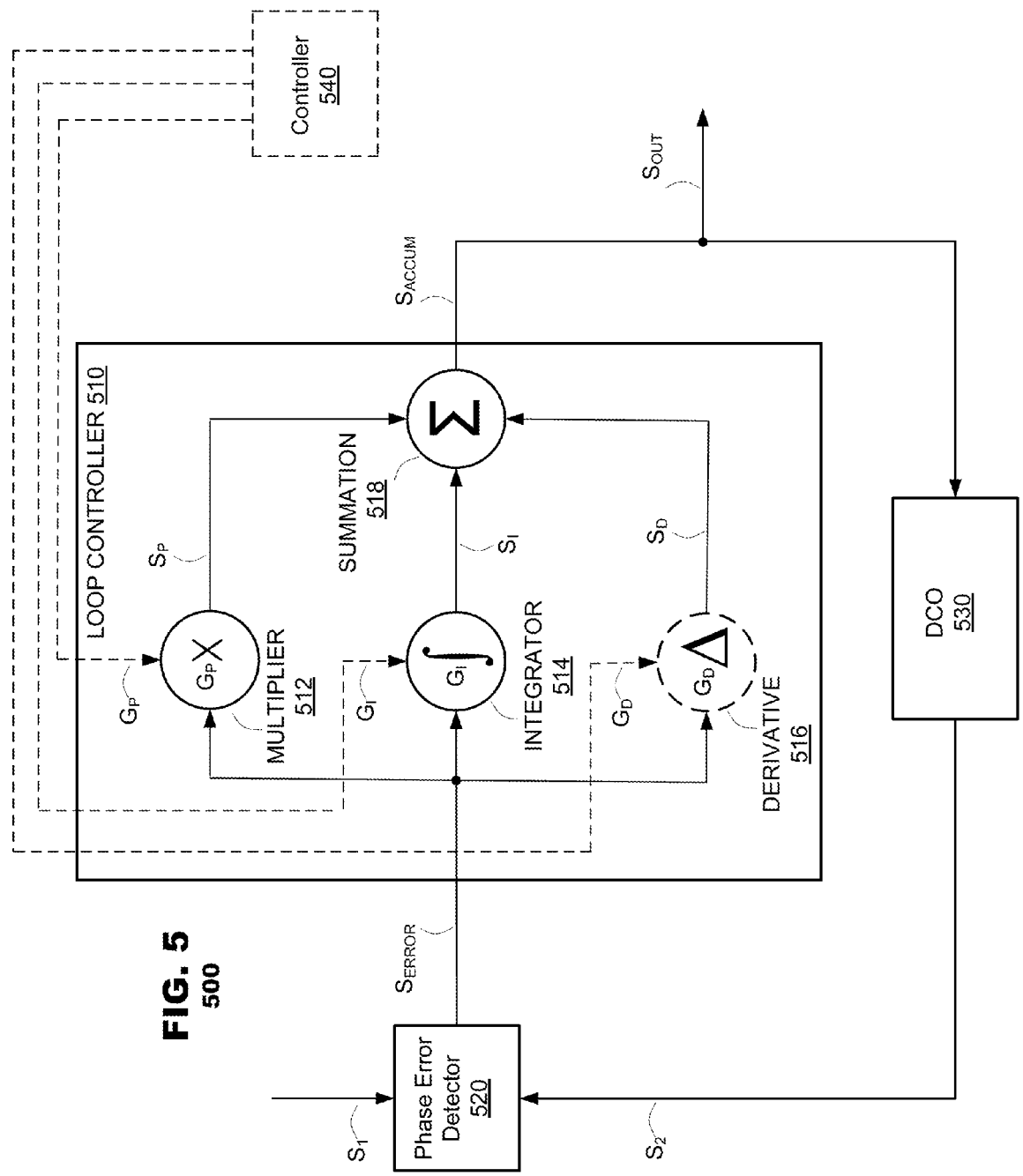
FIGS. 5-6 illustrate block diagrams of frequency detectors with exemplary loop controllers according to an embodiment of the present invention.

FIG. 5 illustrates a block diagram of a frequency detector 500 with a loop controller 510 according to an embodiment of the present invention. The loop controller 510 may find use in a power system application with a frequency detector 500 implemented to detect the fundamental frequency of electricity from the power system. The frequency detector 500 may operate through successive feedback control loops to minimize the frequency or phase difference between an input signal S1 (e.g., electricity from a power system) and a reference signal S2. Over time, the frequency of the reference signal S2 may lock onto the fundamental frequency of the input signal S1 to produce an output signal $S_{OUT}$ with a frequency locked to the fundamental frequency of the input signal S1.

Through each of the successive feedback control loops of the frequency detector 500, a phase error detector 520 may compare the phase of the input signal S1 with the reference signal S2 to generate successive phase error signals $S_{ERROR}$.

Each successive phase error signal $S_{ERROR}$ may be input to the loop controller 510 wherein the loop controller may operate on the phase error signal $S_{ERROR}$ to produce an output control signal $S_{ACCUM}$. The loop controller output signal $S_{ACCUM}$ may be coupled to a digitally controlled oscillator (DCO) 530. Each successive loop controller output control signal $S_{ACCUM}$ may drive the DCO 530 to update the frequency of the reference signal S2 to minimize the phase error between the input signal S1 and the reference signal S2. The loop controller 510 may drive the frequency detector 500 to minimize phase error through successive calculations that may account for the phase error of the present phase error comparison, the past phase error comparisons, or the anticipated phase comparisons.

In an embodiment, the loop controller 510 may include a multiplier 512. The multiplier 512 may multiply $S_{ERROR}$ by a proportional gain control value $G_P$ to generate a proportional output signal $S_P$. The proportional output signal $S_P$ may represent a phase error estimate of the current phase error comparison. A multiplier 512 may be implemented to reduce each current phase error comparison in proportion to its instantaneous value.

In another embodiment, the loop controller 510 may include an integrator 514. The integrator 514 may integrate successive phase error comparisons generated by the phase error detector 520. The integrator 514 may apply a gain control value $G_I$ to each new integration value to generate an integrated output signal $S_I$. The integrator output signal $S_I$ may represent the past phase error of successive phase error comparisons. An integrator 514 may be implemented to slowly drive the phase error between the input signal S1 and the reference signal S2 toward zero by minimizing the cumulative error of each successive phase error comparison as it changes with each updated frequency of the reference signal S2.

In yet another embodiment, the loop controller 510 may include a derivative calculator 516. The derivative calculator 516 may calculate the rate of change between successive phase error comparisons. The derivative calculator 516 may apply a gain control value $G_D$ to each rate of change value to produce a derivative output signal $S_D$. A derivative calculator 516 may be implemented to speed up the rate that the frequency detector 500 converges on the fundamental frequency of the input signal S1 by anticipating the next phase error comparison that may result from the present calculation of the loop controller output control signal $S_{ACCUM}$.

In various embodiments, the input phase error signal $S_{ERROR}$ may be applied to any implementation of the multiplier 512, the integrator 514, and the derivative 516 combination in common. A loop controller 510 implemented in such a manner may be termed a proportional, integrator, derivative (PID) loop controller. Each operation may have its own respective gain control value $G_P$, $G_I$, and $G_D$ that may be used to weight the respective multiplier, integrator, and derivative 512, 514, 516 output signals $S_P$, $S_I$, and $S_D$. A summation 518 may then sum each implemented output signal $S_P$, $S_I$, and $S_D$ to produce an output control signal $S_{ACCUM}$ that updates the frequency of the reference signal S2 through successive feedback control loops. In an embodiment, the gain control values $G_P$, $G_I$, and $G_D$ may be hard-coded in the loop controller 510. In another embodiment, the gain control values $G_P$, $G_I$, and $G_D$ may be communicated to the loop controller 510 by a controller 540.

The rate at which the frequency detector 500 may converge upon the phase of the input signal S1 may be based on several factors including: the signal characteristics of the input signal S1 including any noise that may be present on the signal, the implementation of at least one of the multiplier 512, the integrator 514, and the derivative 516, and their respective gain control values, $G_P$, $G_I$, and $G_D$.

In a power system environment, for example, electricity from the power system may be particularly noisy. Signal spikes and harmonics may be induced from transmission lines and switching devices in the system. However, the fundamental frequency of electricity present in the system may drift slowly within a prescribed tolerance of an expected fundamental frequency for the system (e.g., 60 Hz for US residential power systems). In such environments, implementing the multiplier and integrator 512, 514 may provide an appropriate frequency detector 500 convergence time rather than further implementing the derivative 516.

In such power system applications, the multiplier 512 may be implemented to induce a loop controller 510 response that reacts quickly to the slow frequency changes of an electric input signal S1 thus, decreasing the convergence time of the frequency detector 500. However, the multiplier 512 may produce an output signal $S_p$ that never fully drives the frequency detector 500 to converge on the phase of the electric input signal S1. Rather, the multiplier 512 may instead produce an output signal $S_P$ that is constantly offset from the input signal S1 by a factor corresponding to the proportional gain control value $G_P$. Thus, the integrator 514 may be implemented to compensate for the offset induced by the multiplier operation 512 and fully drive the phase error between the electric input signal S1 and the reference signal S2 to zero. The response time of the integrator 514 may be determined by the integrator gain control value $G_I$. Implementing the integrator 514 without the multiplier 512 may not be beneficial because it reacts slowly to frequency changes and thus, may not be able to keep up with both the frequency changes in the electric input signal S1 and the updating frequency changes in the reference signal S2.

If the electric input signal S1 were noiseless or had very little noise, the derivative 516 could further be implemented in the loop controller 510. The derivative 516 may be useful because it reacts quickly to fast frequency changes and serves to minimize both the inherently slow response of the integrator 514 and the offset induced by the multiplier 512. However, the inherent sensitivity of the derivative 516 to fast frequency changes makes it equally sensitive to high frequency noise that may be present on the electric input signal S1. When high frequency noise is present on the electric input signal S1, the derivative 516 may produce an output signal $S_D$ that erroneously attempts to minimize the effects of the high frequency noise rather than the responses of the multiplier and integrator 512, 514 and thus may introduce instability into the frequency detector 500. Further, because the fundamental frequency of electricity within a power system may change slowly over time, a frequency detector 500 implemented in such a system may not require the derivative 516 to efficiently converge on the fundamental frequency of an electric input signal S1.

It follows that a loop controller 510 with multiplier and integrator 512, 514 may be implemented in a frequency detector 500 to efficiently detect the fundamental frequency of electricity within a power system. As discussed, the respective gain control values $G_P$ and $G_I$ for the multiplier and integrator 512, 514 may be hard-coded within the loop controller 510 or set by the controller 540. These values may be tuned based on the expected input signal frequency and the desired convergence time for the frequency detector 500 to converge on the fundamental frequency of electricity within a power system.

Figure 6:
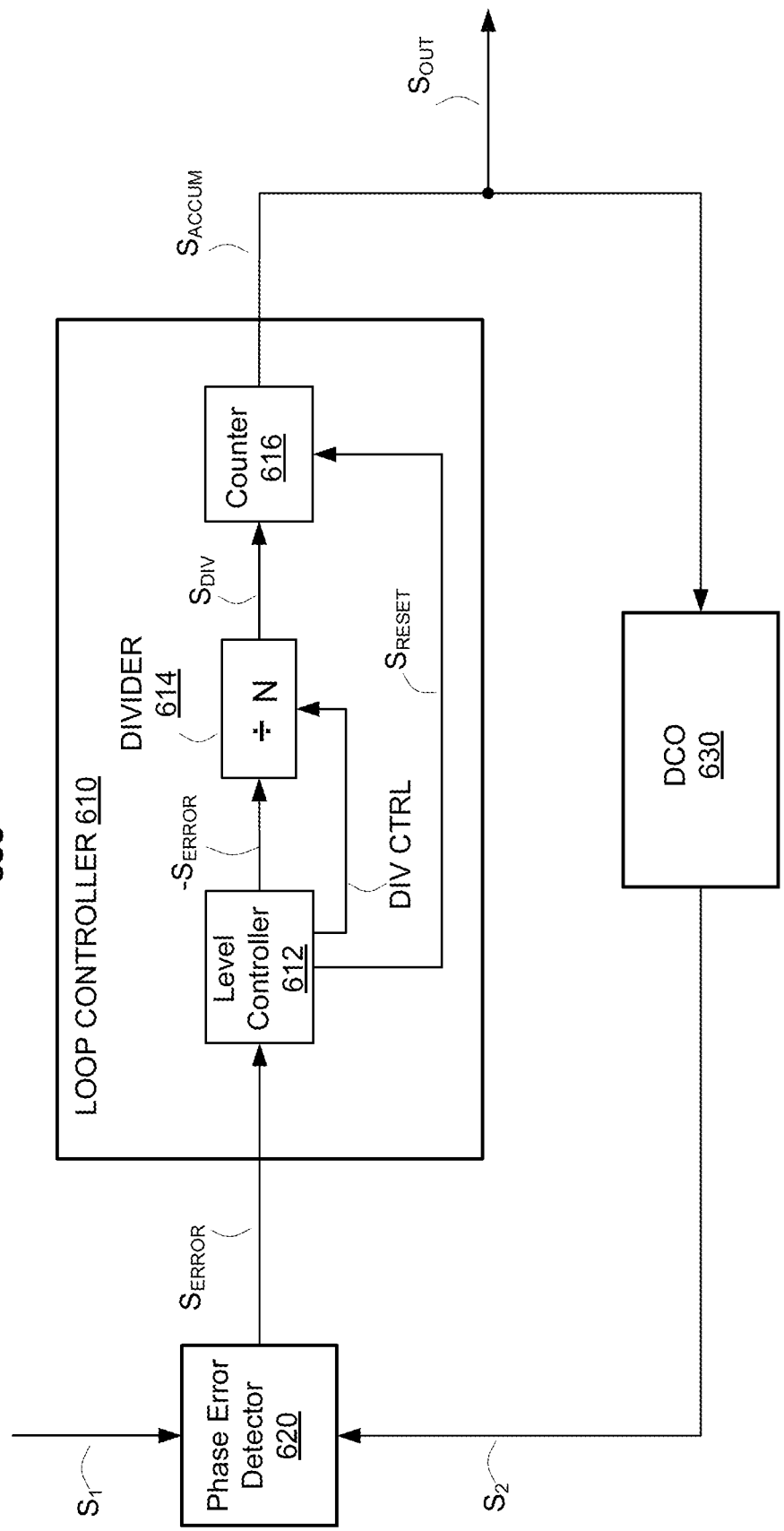

FIG. 6 illustrates a block diagram of a frequency detector 600 with a loop controller 610 according to an embodiment of the present invention. The loop controller 610 may find use in a power system application with a frequency detector 600 implemented to detect the fundamental frequency of electricity from the power system. The frequency detector 600 may operate through successive feedback control loops to minimize the frequency or phase difference between an input signal S1 (e.g., electricity from a power system) and a reference signal S2. Over time, the frequency of the reference signal S2 may lock onto the fundamental frequency of the input signal S1 to produce an output signal $S_{OUT}$ representing the fundamental frequency of the input signal S1.

Through each of the successive feedback control loops of the frequency detector 600, a phase error detector 620 may compare the phase of the input signal S1 with the reference signal S2 to generate successive phase error signals $S_{ERROR}$. Each successive phase error signal $S_{ERROR}$ may be input to a loop controller 610 wherein the loop controller may operate on the phase error signal $S_{ERROR}$ to produce an output signal $S_{ACCUM}$. The loop controller output control signal $S_{ACCUM}$ may be coupled to a digitally controlled oscillator (DCO) 630. Each successive loop controller output control signal $S_{ACCUM}$ may drive the DCO 630 to update the frequency of the reference signal S2 to minimize the phase error between the input signal S1 and the reference signal S2. The reference signal S2 frequency may lock onto the input signal S1 frequency. When it does, the loop controller output control signal $S_{ACCUM}$ may represent the fundamental frequency of the input signal S1.

A loop controller 610 may include a level controller 612, a divider 614, and a counter 616. The level controller 612 may receive the phase error signal $S_{ERROR}$. The level controller 612 may be configured with various threshold levels and may associate the magnitude of the input phase error signal $S_{ERROR}$ within a certain threshold level. Each threshold level may have an associated a divider control number $N_1$-$N_N$ representing a real number. The level controller 612 may have an output control signal DIV CTRL to set the divider control number $N_1$-$N_N$ for the divider 614. The level controller 612 may further negate the sign of the input phase error signal $S_{ERROR}$ before outputting the signal to the divider 614. The divider 614 may divide the sign inverted phase error signal $-S_{ERROR}$ by a level-associated divider control number $N_N$ and output a signed real number $S_{DIV}$ to the counter 616. The counter 616 may accumulate successive divisions from the divider 614 to output a loop controller output control signal $S_{ACCUM}$ representing a cumulative frequency error between the input signal S1 and the reference signal S2.

The rate at which the frequency detector 600 may converge upon the phase of the input signal S1 may be based on the frequency range that the input signal S1 may be expected to drift across. For example, a frequency detector in a power system application may have a level controller configured with three threshold levels covering a range of +/−5 Hz for a 10 Hz expected frequency drift of the input signal S1 (i.e., 55 Hz to 65 Hz). Each threshold level may be configured to correspond a magnitude (unsigned value) of the frequency difference between the input signal S1 and the reference signal S2. For example, the level detector 612 may be configured with a first threshold level covering an error range of 0-1 Hz, a second threshold level covering an error range of 1-3 Hz, and a third threshold level covering an error range of 3-5 Hz.

The level controller 612 in the present example may be further configured to associate a divider control number $N_1$-$N_3$ with each of the three threshold levels. For example, a frequency difference in the range of the first threshold level (i.e., 0-1 Hz) may require a fine frequency adjustment as opposed to frequency difference in the range of the third threshold level (i.e., 3-5 Hz) that may require a more coarse frequency adjustment. Thus, a divider control number for the first level may be set with $N_1=4$ (providing finer adjustments), while a divider control number for the third level may be set with $N_3=2$ (providing coarser adjustments). After the level detector 612 determines an appropriate threshold level for a phase error value, it may negate the sign for the phase error signal $S_{ERROR}$ before driving the signal into the divider 614. Recall that a positive phase error difference may correspond to the reference signal S2 frequency leading the input signal S1 frequency. This, in turn, may require that the reference signal S2 frequency generated from the DCO 630 needs to be slowed down. Thus, the sign of the loop controller output control signal $S_{ACCUM}$ may be negated with respect to the sign of the phase error signal $S_{ERROR}$.

Next, the divider 614 may receive the sign negated phase error signal $-S_{ERROR}$ and divide the signal by a divider control number $N_N$ as set by the level controller 612 to generate an output signal $S_{DIV}$ representing a proportional value of the instantaneous phase error. The counter 616 may receive the divider output signal $S_{DIV}$ and, through successive feedback control loops, maintain a cumulative phase estimate of the input signal S1 as compared to the reference signal S2. When the frequencies of the two signals converge, the phase error difference between the two signals may be minimized. At convergence, the counter 616 may produce a phase error estimate $S_{ACCUM}$ that is phase locked with the fundamental frequency of the input signal S1. The output signal $S_{OUT}$ may represent the fundamental frequency of the input signal S1.

The level controller 612 may also include a feature that increments the divider control number $N_1$ associated with the first threshold level for successive phase error signals $S_{ERROR}$ that fall within the first threshold level (i.e., $N_1=4$ for the first pass through the loop, $N_1=5$ for the second pass, etc). The effect of incrementing the divider control number $N_1$ may be to provide finer frequency adjustments of the reference signal S2 when the frequency difference between the two signals remains within the first threshold level through successive feedback control loops. However, if a phase error signal $S_{ERROR}$ from a successive loop jumps outside the range of the first level threshold, the level counter 612 may reset the divider control number $N_1$ associated with the first threshold level to its initial value.

Further, the level controller 612 may also reset the cumulative value stored in the counter 616 to zero should the phase error signal $S_{ERROR}$ suddenly jump from, say, the first threshold level to the third threshold level after having been settled in the first threshold level for a predetermined period of time. Such a jump in threshold levels might indicate a system glitch or an interruption in the input signal 51 and therefore the cumulative value of the counter 616 may need to be reset. The criteria for determining when the counter 616 may be reset may be a system-configurable feature. The range of threshold levels and each divider control number $N_1$-$N_N$ associated with a threshold level may also be a system-configurable feature. Finally, the increment range for the first threshold level control number $N_1$ as well as the increment amount for this number (either whole number or fractional increments) may also be a system-configurable feature.

As illustrated in FIG. 7, a frequency detector may find use in a motor control system 700 where the frequency of electricity in the windings of a motor stator may be monitored and the speed of the motor may be controlled by changing the frequency of electricity injected to the motor. In such applications, determining the precise frequency of electricity in the stator windings may provide for precision speed control of the motor.

In a motor control system 700, an electric signal 760 may flow into a control system 710. An embodiment of a control system 710 may include a frequency detector 720, a controller 730, and a motor driver 740. The electric signal 760 may flow into the control system 710 and may be coupled to the motor driver 740. The motor driver 740 may supply electricity to a motor 750 via a voltage control signal $V_{CONTROL}$. By increasing or decreasing the frequency of the voltage control signal $V_{CONTROL}$, the motor driver 740 may increase or decrease the motor 750 speed. To control the precise speed of the motor 750, the frequency of the motor stator windings may be monitored by the frequency detector 720 via a motor frequency signal $F_{MOTOR}$. The frequency detector 720 may detect the fundamental frequency of motor frequency signal $F_{MOTOR}$ and may output a signal $F_{OUT}$ with a frequency locked to that fundamental frequency. In turn, the controller 730 may receive the frequency detector output signal $F_{OUT}$ and may generate a frequency control word $F_{CONTROL}$ that may tune the motor driver 740 to adjust the motor 750 speed to a desired speed by changing the frequency of the voltage control signal $V_{CONTROL}$.

Several embodiments of the present invention are specifically illustrated and described herein. However, it will be appreciated that modifications and variations of the present invention are covered by the above teachings and within the purview of the appended claims without departing from the spirit and intended scope of the invention.

I claim:

1. A method for operating a frequency detector to detect the fundamental frequency of an electric signal using a feedback control loop, comprising:
    initializing a local reference signal at a predetermined frequency;
    comparing transitions of an input signal and the local reference signal to generate successive phase error signals;
    calculating a running average of successive phase error signals over a predetermined time period;
    updating the frequency of the local reference signal responsive to the running average; and
    outputting the running average from the frequency detector as an estimate of the fundamental frequency of the input signal.

2. The method of claim 1, wherein the outputting of the running average as the estimate of the fundamental frequency of the input signal further comprises filtering the running average.

3. The method of claim 1, further comprising responsive to calculating a difference between an expected frequency of the input signal and the running average, if the difference diverges beyond a predetermined threshold, setting the running average to zero and initializing the local reference signal at a predetermined frequency.

4. The method of claim 3, wherein initializing the local reference signal at a predetermined frequency further comprises initializing the predetermined frequency to an approximation of the expected frequency of the electric input signal.

5. The method of claim 1, wherein initializing the local reference signal at a predetermined frequency further comprises initializing the predetermined frequency to an approximation of the expected frequency of the electric input signal.

6. The method of claim 1, further comprising multiplying successive phase error signals by a proportional gain value and producing successive output signals therefrom; and summing the successive multiplied output signals to produce successive accumulations of the output signals therefrom.

7. The method of claim 1, further comprising integrating successive phase error signals with a gain value applied and producing successive output signals therefrom; and summing the successive integrated output signals to produce successive accumulations of the output signals therefrom.

8. The method of claim 1, further comprising calculating derivatives of successive phase error signals with a gain value applied and producing successive output signals therefrom; and summing the successive derivative calculation output signals to produce successive accumulations of the output signals therefrom.

9. The method of claim 1, wherein the initializing of the reference signal is performed on the basis of the running average.

* * * * *